United States Patent [19]
Itemadani et al.

[11] Patent Number: 4,738,386
[45] Date of Patent: Apr. 19, 1988

[54] ELECTRONIC COMPONENT TRANSPORTING APPARATUS EMPLOYING TAPING CASSETTES

[75] Inventors: Eiji Itemadani; Kanji Hata; Masahiro Maruyama, all of Osaka, Japan

[73] Assignee: Matsushita Electric Industrial Co., Ltd., Osaka, Japan

[21] Appl. No.: 840,849

[22] Filed: Mar. 18, 1986

[30] Foreign Application Priority Data

Mar. 20, 1985 [JP] Japan .................................. 60-56740

[51] Int. Cl.$^4$ ........................... B32B 3/10; G03B 1/18; G03B 1/24
[52] U.S. Cl. ..................................... 226/52; 156/584; 226/76
[58] Field of Search ........................ 226/52, 53, 76, 77; 156/344, 584

[56] References Cited

U.S. PATENT DOCUMENTS 2,415,442  2/1947  Rackett ............................. 226/76 X
3,762,617  10/1973  Matthis ............................ 226/53 X
3,910,475  10/1975  Pundsack et al. ................. 226/52 X
4,197,799  4/1980  Sato ................................... 226/53 X Primary Examiner—John Petrakes
Assistant Examiner—Lynn M. Sohacki
Attorney, Agent, or Firm—Pollock, VandeSande & Priddy

[57] ABSTRACT

An electronic component transporting apparatus employing taping cassettes includes a toothed wheel arranged for meshing engagement within successive compartments of a taping cassette after a sealing tape has been stripped from the taping cassette and components contained in compartments thereof have been successively removed, whereby stepwise rotation of the toothed wheel is utilized to produce stepwise advancement of the taping cassette for successive removal of electronic components contained in the compartments. Since it is not necessary to provide a line of perforations along an elongated side of each taping cassette, for use in driving the cassette, each cassette can be made substantially smaller in width than has been possible in the prior art.

4 Claims, 3 Drawing Sheets

ELECTRONIC COMPONENT TRANSPORTING APPARATUS EMPLOYING TAPING CASSETTES

BACKGROUND OF THE INVENTION

The present invention relates to an electronic component transporting apparatus employing taping cassettes. Taping cassettes are elongated containers for leadless electronic components, such as capacitors and resistors in chip form. Each taping cassette has a series of compartments arranged at regular spacings along the direction of elongation, each compartment accommodating a single electronic component, the compartments being sealed by a longitudinally extending length of sealing tape which is removably attached (i.e. by suitable adhesive material) to the body of the taping cassette. Such taping cassettes are generally used in the manufacturing of electronic equipment, for transporting small electronic components to be successively mounted on electronic circuit substrates or circuit boards by automatic apparatus.

An example of a prior art type of electronic component transporting apparatus employing taping cassettes is disclosed in Japanese patent No. 56-118698. That apparatus is only applicable to taping cassettes which are of the form shown in FIG. 1, in which the body of the taping cassette (formed of relatively thick tape) is indicated as b. A series of compartments g for respectively accommodating electronic components is formed by rectangular apertures formed in taping cassette body b, with the base of each of compartments g being formed by a retaining tape e which is attached to the lower surface of the body b. A sealing tape d is attached to the upper face of body b, for sealing respective electronic components f within successive ones of compartments g. A series of perforations c is formed along one side of body-b of the taping cassette, adjacent to one edge of the taping cassette as shown. The perforations c are provided to permit the taping cassette to be moved along the direction of elongation thereof, by appropriate drive means engaged within the apertures c, i.e. peripheral toothed portions of a drive wheel, whereby the taping cassette can be successively moved into specific positions.

However the necessity of such a prior art of taping cassette to form the perforations c along one side of the cassette results in the overall width H of the taping cassette being increased beyond the minimum width necessary for accommodating the electronic components. This increase in width presents several problems. For example, an electronic component mounting apparatus is disclosed in the above-mentioned Japanese patent No. 55-118698 whereby a plurality of taping cassettes is disposed mutually parallel within a component supply section. However if the width H of each taping cassette is relatively large, then the overall size of the component supply section will be correspondingly increased, thereby increasing the size of the electronic component mounting apparatus. In addition, a portion of the electronic component mounting apparatus must move between different ones of the plurality of taping cassettes, to sequentially select and remove components from different taping cassettes. Any increase in the width H of each taping cassette will result in an increase in the time required to perform such component selection and removal, so that the maximum rate of productivity will be lowered.

SUMMARY OF THE INVENTION

It is an objective of the present invention to overcome the problems of the prior art described above, by providing an electronic component transporting apparatus employing taping cassettes whereby the necessity for forming a series of perforations along one side of each cassette is eliminated.

To achieve this objective, an apparatus according to the present invention drives a taping cassette along the direction of elongation thereof by means of a toothed wheel having peripheral teeth which are arranged to engage with compartments of the taping cassette following successive removal of the sealing tape and the contained electronic components from the compartments.

More specifically, an electronic component transporting apparatus according to the present invention is employed for transporting a plurality of electronic components respectively contained in successive compartments formed in a taping cassette at equidistant spacings along the direction of elongation thereof and sealed within the compartments by a sealing tape. Tape stripping means is provided for stripping the sealing tape from successive ones of the compartments. Electronic component removal means for removing the electronic components from successive ones of the compartments following stripping of the sealing tape. Included is cassette drive means including a toothed wheel having peripherally formed teeth thereon at angular spacings corresponding to the equidistant spacings of the compartments of the taping cassette, the toothed wheel being positioned for meshing with the peripheral teeth within successive ones of the compartments following removal of the electronic components therefrom, and means for producing stepwise rotation of the toothed wheel to execute unidirectional stepwise advancement of the taping cassette along the direction of elongation thereof by steps of amplitude equal to the spacing between the compartments of the taping cassette.

DESCRIPTION OF THE PREFERRED EMBODIMENTS

Figure 2:
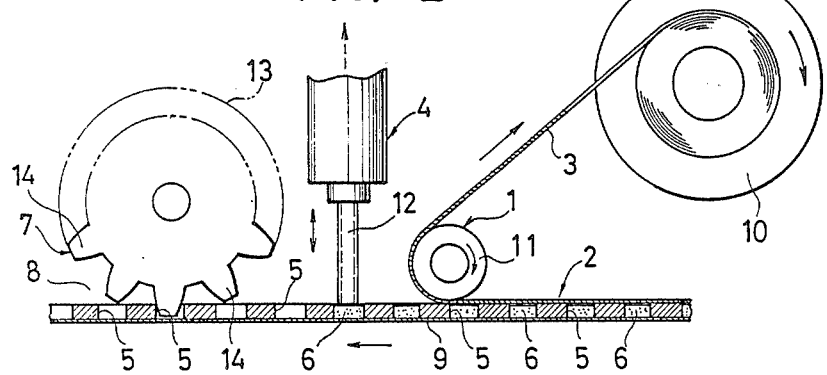
FIG. 2 and FIG. 3 are a side view and plan view respectively of a first embodiment of an electronic component transporting apparatus according to the present invention.
Figure 3:
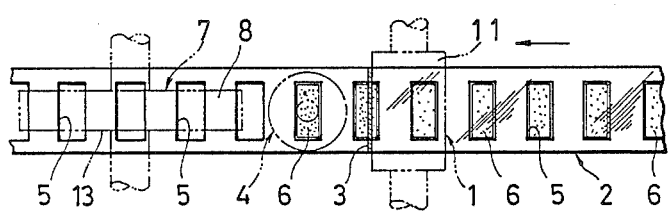
Figure 4:
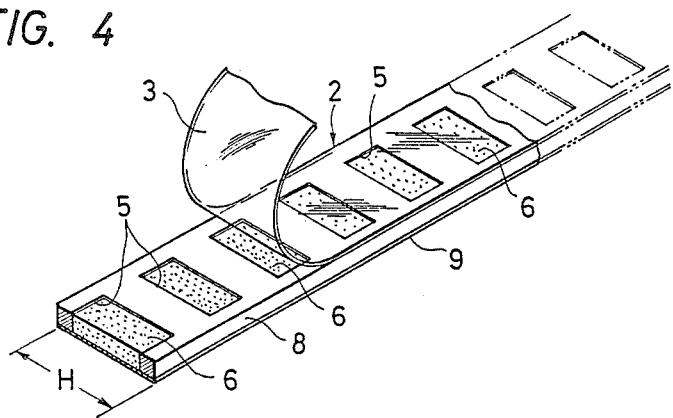
FIG. 4 is an oblique view illustrating the configuration of a taping cassette for use with an electronic component transporting apparatus according to the present invention.

FIG. 2 shows a side view of a first embodiment of an electronic component transporting apparatus according to the present invention, in which an electronic component transporting apparatus is shown in cross-section. FIG. 3 is a corresponding view in plan, while FIG. 4 is an oblique view showing the configuration of a taping cassette for use with the apparatus of FIGS. 2 and 3. As shown in FIG. 4, no lateral perforations are formed along the taping cassette, denoted by reference numeral 2, so that the width H of the taping cassette can be minimized. Reference numeral 1 denotes a sealing tape stripping apparatus, for stripping a sealing tape 3 from taping cassette 2, prior to removal of electronic components 6 from compartments 5 of taping cassette 2. Reference numeral 4 denotes a component removal apparatus, for removing electronic components 6 from successive ones of compartments 5 of taping cassette 2 after compartments 5 have been unsealed by stripping apparatus 1. A taping cassette drive apparatus 7 serves to drive the taping cassette 2 along the direction of elongation thereof, by a unidirectional stepping operation, with the direction of movement of taping cassette 2 being as indicated by the arrow in FIG. 2. The sealing tape stripping apparatus 1, component removal apparatus 4 and the taping cassette drive apparatus 7 are successively positioned along the direction of elongation of the taping cassette 2 as shown.

As shown in FIG. 4, the taping cassette 2 is formed of a tape body 8, in which rectangular apertures are formed at equidistant spacings, with a retaining tape 9 being fixedly attached to the lower face of the tape body 8, whereby a plurality of compartments 5 is defined by the aforementioned rectangular apertures in tape body 8 and the retaining tape 9. Electronic components 6 are respectively contained within these compartments 5, which are sealed by sealing tape 3 which is removably attached to the upper face of tape body 8. The sealing tape 3 is preferably formed of a transparent material.

Figure 1:
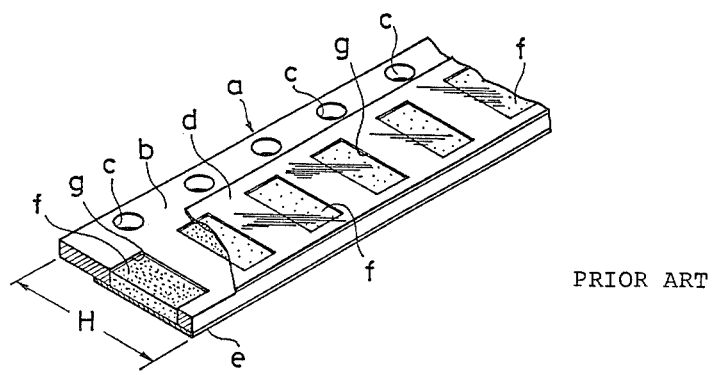
FIG. 1 is an oblique view of a taping cassette for use with a prior art type of electronic component transporting apparatus.

The sealing tape stripping apparatus 1 is made up of a reel 10, onto which the sealing tape is wound following stripping from the taping cassette 2, and a roller 11. The component removal apparatus 4 employs vacuum suction, and includes a vacuum chuck 12 which applies suction to cause successive ones of electronic components 6 to adhere thereto, with the adhering component 6 being then moved upward by vacuum chuck 12 as indicated by the arrow, to be thereafter moved to a requisite position for component mounting, by apparatus which is omitted from the drawings. The taping cassette drive apparatus 7 includes a toothed wheel 13 provided with peripheral teeth 14 which are positioned for meshing engagement within the compartments 5 of taping cassette 2, following removal of electronic components 6 therefrom by the component removal apparatus 4, i.e. with the angular spacing between adjacent ones of peripheral teeth 14 being arranged to correspond to the spacing between adjacent ones of compartments 5 of taping cassette 2. The toothed wheel 13 is periodically unidirectionally driven through a fixed angle of rotation by a drive apparatus (which is omitted from the drawings for simplicity of description), to thereby produce successive unidirectional stepwise advancements of taping cassette 2 in the direction of elongation thereof, i.e. from right to left as seen in FIG. 2. The amplitude of each of these stepwise advancements is identical to the spacing between adjacent ones of compartments 5, so that the compartments 5 of taping cassette 2 become successively positioned below the vacuum chuck 12 of component removal apparatus 4, following removal of the sealing tape 3. In this way, stepwise rotation of toothed wheel 13 produces stepwise movement of taping cassette 2 along the direction of elongation thereof, without the necessity of providing a set of lateral perforations along the taping cassette, such as are required in the prior art as described hereinabove with reference to FIG. 1. The width H of taping cassette 2 can thereby be minimized, so that the size of a mounting apparatus incorporating a plurality of such taping cassettes can be made substantially smaller than has been possible hitherto.

Figure 5:
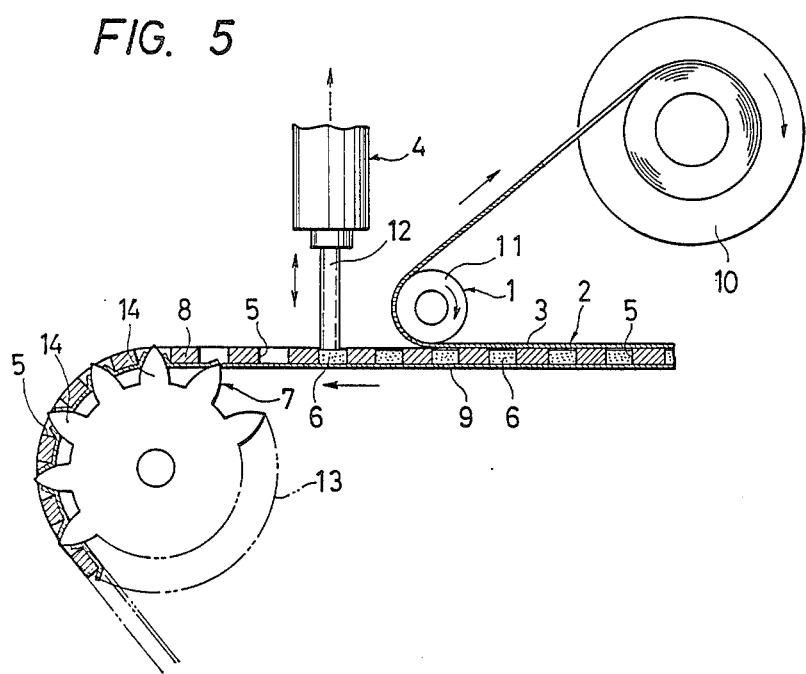
FIG. 5 is a side view of a second embodiment of the present invention, in which teeth of a drive wheel successively penetrate a retaining tape.
Figure 6:
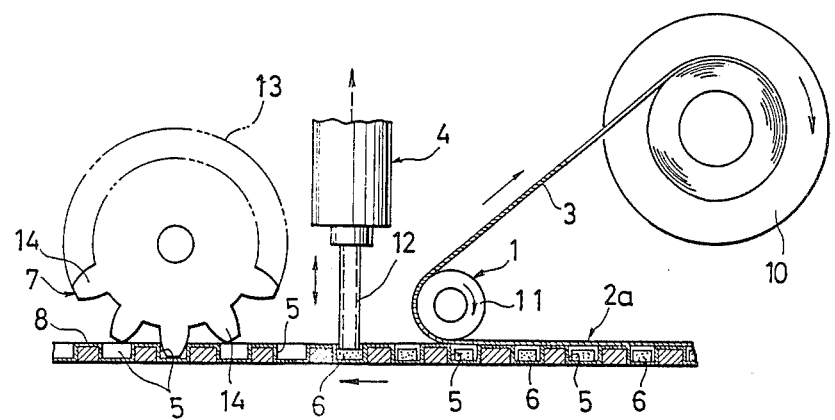
FIG. 6 and FIG. 7 are a side view and plan view respectively of the embodiment of FIGS. 1 and 2 as applied to an alternative configuration of taping cassette.

FIG. 5 shows another embodiment of an electronic component transporting apparatus according to the present invention, which differs from the previous embodiment only in the manner in which the toothed wheel 13 engages with the taping cassette 2. In the embodiment of FIG. 6, the toothed wheel 13 is positioned below the taping cassette 2, and the tip of each of the teeth 14 of toothed wheel 13 is made sufficiently sharp to implement penetration of the teeth 14 into the retaining tape 9 of taping cassette 2, and hence into the interior of successive ones of compartments 5 of taping cassette 2. In this way, meshing engagement between the toothed wheel 13 and the compartments 5 of taping cassette 2 is achieved, whereby stepwise advancement of taping cassette 2 along the direction of elongation thereof is accomplished by stepwise rotation of toothed wheel 13. In all other respects, the embodiment of FIG. 5 is identical to that of FIG. 2 described above. As indicated in FIG. 5, the portion of taping cassette 2 which is in meshing engagement with the toothed wheel 13 is curved into an arc which corresponds to approximately half of the circumference of toothed wheel 13.

Figure 7:
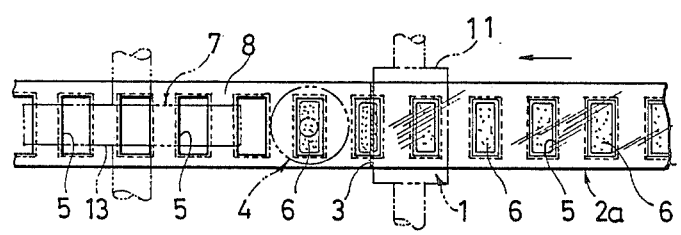

An electronic component transporting apparatus according to the present invention is not limited to use with a taping cassette having the configuration shown in FIG. 4. It is possible for example to form the body of the taping cassette integrally from a single strip of suitable plastic material, such as a synthetic resin material, to thereby define the compartments 5 without the use of the retaining tape 9 which is employed in the example of FIG. 4, but with the compartments being sealed by a sealing tape as in the examples of FIG. 4, FIG. 6 and FIG.7 which show a side view and a plan view respectively of an electronic component transporting apparatus having the configuration shown in FIG. 2, applied to a taping cassette having such an alternative configuration, denoted as 2a.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. An electronic component handling apparatus for handling a plurality of electronic components respectively contained in successive compartments formed in a taping cassette at equidistant spacings along the direction of elongation thereof and sealed within said compartments by a sealing tape, the apparatus comprising:
   tape stripping means for stripping said sealing tape from successive ones of said compartments;
   electronic component removal means for removing said electronic components from respective ones of said compartments following stripping of said sealing tape; and taping cassette drive means for engagement with successive ones of said compartments subsequent to stripping of said sealing tape therefrom and removal of said components therefrom and operaable to execute stepwise unidirectional advancement of said tape cassette.

2. An electronic component transporting apparatus as claimed in claim 1, wherein said tape stripping means, electronic component removal means and tape cassette drive means are respectively positioned, the order named, along the direction of elongation of said taping cassette.

3. An electronic component transporting apparatus according to claim 1, in which said taping cassette drive means comprise a toothed wheel having peripherally formed teeth thereon at angular spacings corresponding to said equidistant spacings of said compartments of said taping cassette, said toothed wheel being positioned for meshing engagement of said peripheral teeth within successive ones of said compartments following removal of said electronic components therefrom, and means for producing stepwise rotation of said toothed wheel to execute unidirectional stepwise advancement of said taping cassette along the direction of elongation thereof by steps of amplitude equal to said spacing between said compartments of said taping cassette.

4. An electronic component transporting apparatus according to claim 3, in which each of said teeth of said toothed wheel is formed with a sharp cutting edge, and in which said toothed wheel is positioned with respect to said taping cassette such that said teeth sequentially penetrate into successive ones of said compartments through a base portion of each compartment, to thereby meshingly engage with said compartments.

* * * * *